United States Patent [19]
Kashmiri et al.

[11] Patent Number: 5,926,055
[45] Date of Patent: Jul. 20, 1999

[54] FIVE VOLT OUTPUT CONNECTION FOR A CHIP MANUFACTURED IN A THREE VOLT PROCESS

[75] Inventors: Abdual Q. Kashmiri, Fremont; Mahmud Assar, Morgan Hill, both of Calif.

[73] Assignee: Cirrus Logic, Inc., Fremont, Calif.

[21] Appl. No.: 08/771,619

[22] Filed: Dec. 20, 1996

[51] Int. Cl.[6] ............................................... H03L 5/00
[52] U.S. Cl. ........................... 327/333; 327/434; 326/80; 326/81; 326/63
[58] Field of Search ................................ 326/62, 63, 80, 326/68, 81; 327/333, 427, 434

[56] References Cited

U.S. PATENT DOCUMENTS

| 5,146,118 | 9/1992 | Nakamura et al. | 326/81 |
| 5,378,943 | 1/1995 | Dennard | 326/81 |
| 5,559,464 | 9/1996 | Orii et al. | 327/333 |
| 5,680,068 | 10/1997 | Ochi et al. | 327/333 |

Primary Examiner—Timothy P. Callahan
Assistant Examiner—Jung Ho Kim
Attorney, Agent, or Firm—Lowe, Price, LeBlanc & Becker; Steven A. Shaw

[57] ABSTRACT

An output circuit for producing 5 volt output signals from a chip that is manufactured in a 3 volt process, is provided with a control signal logic circuit, a pseudoground generating circuit, and an output signal generation circuit. The control signal logic circuit receives 3 volt data signals from the internal logic circuitry of the chip, and produces control signals as a function of these 3 volt data signals. The pseudoground generating circuit is coupled to the control signal logic circuit and generates a pseudoground greater than zero volts and intermediate output signals as a function of the control signals produced by the control signal logic circuit. The output signal generation circuit is coupled to the pseudoground generating circuit and generates the 5 volt output signals as a function of the intermediate output signals generated by the pseudoground generating circuit. As a result of the creation of the pseudoground, the voltage differential to which the semiconductor devices in the output circuit are subjected is always less than 5 volts. This prevents the rapid degradation of the oxide layer in the semiconductor devices of the output circuit, allowing the 3 volt process chip to interface with 5 volt process devices without premature failure of the chip.

13 Claims, 3 Drawing Sheets

FIVE VOLT OUTPUT CONNECTION FOR A CHIP MANUFACTURED IN A THREE VOLT PROCESS

BACKGROUND OF THE INVENTION

1. Technical Field of the Invention

The present invention relates to the field of electronic circuitry, and more particularly, to output circuitry that drives an output signal off a chip.

2. Description of Related Art

Chips carrying electronic circuitry for use in all manner of devices, such as computers, appliances, automobiles, etc., can be manufactured by different processes. For example, a chip can be manufactured in a 5 volt process or in a 3 volt process. Generally speaking, the electronic devices (such as transistors) in a chip that is manufactured in a 5 volt process will have thicker layers than in a chip that is manufactured in a 3 volt process. It is also possible that different insulation materials can be used to differentiate between the processes. A 3 volt process suggests a higher integration density than a 5 volt process because all of the dimensions of the devices, including thickness, may be smaller.

The particular process by which a chip is manufactured will normally determine the manner in which the chip can be used. A chip manufactured by the 5 volt process will operate with logic voltage levels of 0 and 5 volts. Similarly, a chip manufactured by the 3 volt process will operate with logic voltage levels of 0 and 3 volts. For a device on the chip, such as a P channel transistor implemented in CMOS (complementary metal-oxide semiconductor) technology, this means that the transistor will be subjected to voltage differentials in the oxide layer between the gate and the substrate of either 5 or 3 volts, depending on whether the chip was manufactured by a 5 volt or a 3 volt process.

When the oxide layer of a device manufactured in a 5 volt process is subjected to 5 volts, (or a device manufactured in a 3 volt process is subjected to 3 volts) the device will normally operate reliably for the life expectancy of the chip. However, when the oxide layer of a device manufactured in a 3 volt process is subjected to a 5 volt differential, the oxide layer in the device will rapidly degrade. The device in the chip will then fail much earlier than the life expectancy of the chip. For example, a chip manufactured by the 3 volt process that has a normal life expectancy of 5 years, but has devices subjected to 5 volt differentials across the device, may fail in only 2 years. The reliability of such a 3 volt process chip placed in this situation will therefore be suspect.

There are advantages, however, provided by a chip that can produce 5 volt output signals but is manufactured in a 3 volt process. The current trend in chip manufacturing is to produce 3 volt process chips, due to the higher integration that is possible, the lower power consumption, and the reduced cost of the chips. However, there are still many chips and other apparatus that use logic voltage levels of 0 and 5 volts. It is therefore desirable to provide a 3 volt process chip that will be able to interface with chips that are manufactured in a 5 volt process. An obstacle to this interfacing (the production of 5 volt output signals) is the rapid degradation of the oxide layers of the devices in the 3 volt process chip when 5 volts are applied across the oxide layers. This rapid degradation causes the device to fail earlier than the expected life expectancy of the chip, making the chip unreliable.

SUMMARY OF THE INVENTION

There is a need for a chip manufactured in a lower voltage process that is able to interface with chips manufactured in a higher voltage process, but whose devices will not degrade rapidly due to the higher voltage.

This and other needs are met by the present invention which provides an output circuit for producing N-voltage level output signals from a chip manufactured in an M-voltage level process, where M is less than N. The output circuit comprises a control signal logic circuit that receives M-voltage level data signals to be generated as N-voltage level output signals off the chip, and produces control signals as a function of the received data signals. A pseudoground generating circuit is coupled to the control signal logic circuit. The pseudoground generating circuit generates a pseudoground greater than zero volts and intermediate output signals as a function of the control signals produced by the control signal logic circuit. An output signal generation circuit is coupled to the pseudoground generating circuit, and generates the N-voltage level output signals as a function of the intermediate output signals generated by the pseudoground generating circuit. In certain preferred embodiments of the invention, the pseudoground generating circuit and the output signal generation circuit include semiconductor devices, and the voltage differential across the semiconductor devices at any time is less than N volts.

By providing a pseudoground that is greater than zero volts the present invention assures that the voltage differential across the semiconductor devices of the output circuit at any time is less than N volts. This prevents the rapid degradation of the oxide layer of the semiconductor devices that lead to premature failure of the devices and the chip, when a chip manufactured in a 3 volt process is to produce output signals at a 5 volt level for other chips, for example.

The earlier stated needs are met by another aspect of the present invention which provides a chip manufactured in an M-volt process, the chip comprising internal logic circuitry that generates M-volt data output signals, an output connection at which output signals of the chip are produced, and an output circuit coupled between the internal logic circuitry and the output connection. The output circuit receives the M-volt data output signals and generates N-volt data output signals. The output circuit has semiconductor devices wherein a voltage differential across each of the semiconductor devices at any time is less than N volts.

The foregoing and other features, aspects and advantages of the present invention will become more apparent from the following detailed description of the present invention when taken in conjunction with the accompanying drawings.

DETAILED DESCRIPTION OF THE ILLUSTRATIVE EMBODIMENTS

Figure 1:
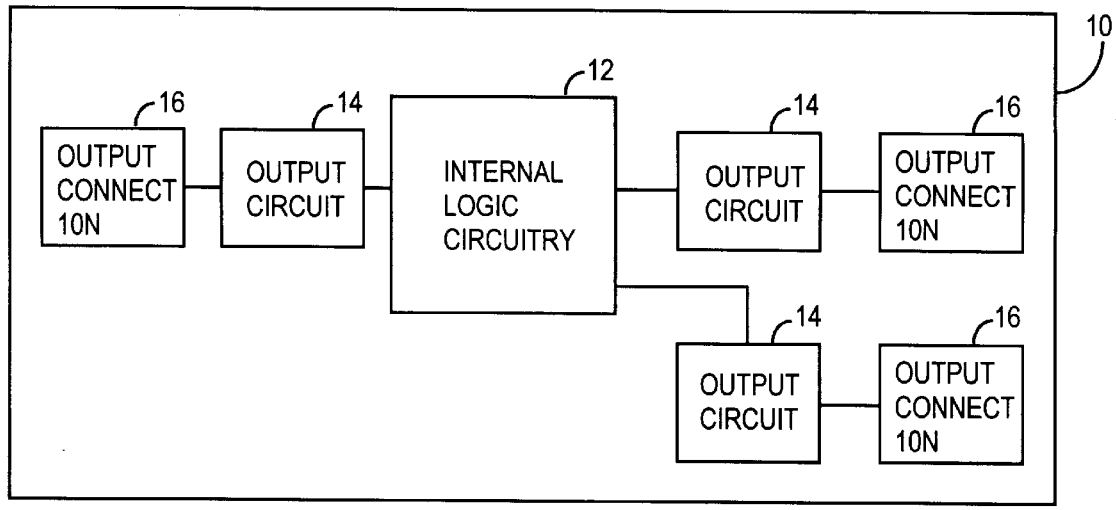
FIG. 1 is a block diagram of a chip constructed in accordance with the present invention.

FIG. 1 is a block diagram of a chip 10 constructed in accordance with an embodiment of the present invention. The chip 10 can be any type of chip that provides output signals to other devices or chips in a system. The chip 10 has internal logic circuitry 12 that performs the functions of the chip 10. The output signals from the logic circuitry 12 are sent off-chip through an output circuit 14 and an output connection 16. A plurality of output circuits 14 and output connections 16 are provided on the chip 10, for the various output signals generated by the logic circuitry 12.

In the exemplary embodiment of the present invention, the chip 10 is a 3 volt process fabricated chip. A 3 volt process chip has thinner layers, or uses different insulation materials, than a 5 volt process chip, for example. Further, a higher integration density of the logic circuitry suggests a lower voltage process because all the dimensions, including thickness of the layers, may be less.

Figure 2:
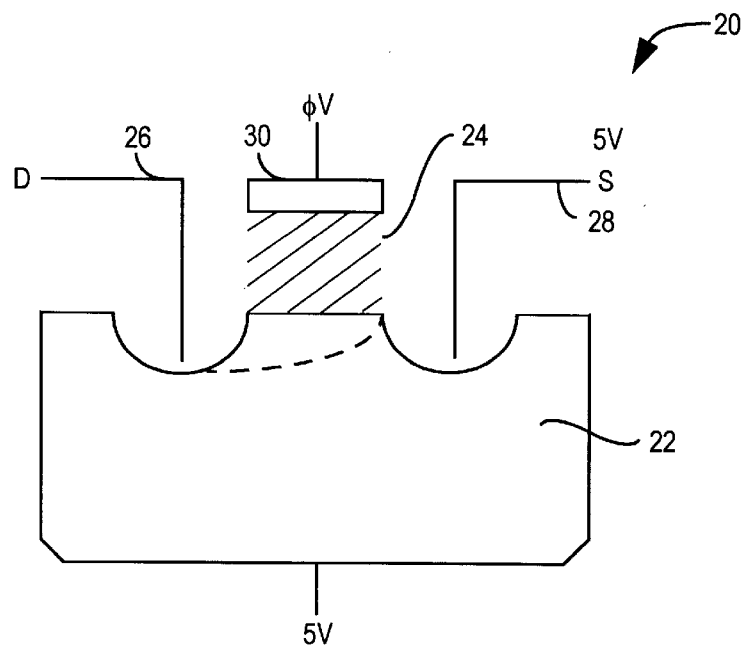
FIG. 2 is a cross-section of a semiconductor device.

As a result of the different manufacturing process, the devices in a 3 volt process chip are not able to withstand relatively large voltage differentials across the layers of the device. For example, a standard device 20 is depicted in FIG. 2. The device 20 has a substrate 22, an oxide layer 24, a drain 26, a source 28 and a gate 30. When a voltage differential of 5 volts occurs between the gate 30 and the bottom of the substrate 22, the oxide layer 24 will undergo degradation if the device was manufactured in a 3 volt process. Although the devices in a 3 volt process chip 10 can normally operate for some amount of time with 5 volt differentials, the degradation will eventually cause the devices to fail prior to the anticipated life expectancy of the chip. This makes a conventional 3 volt process chip 10 unreliable when operated at 5 volts. However, it is still desirable in many instances to produce 5 volt output signals from a 3 volt process chip, since many other chips continue to operate with signals of 5 volts and require that input signals from other sources be at this level.

Figure 3:
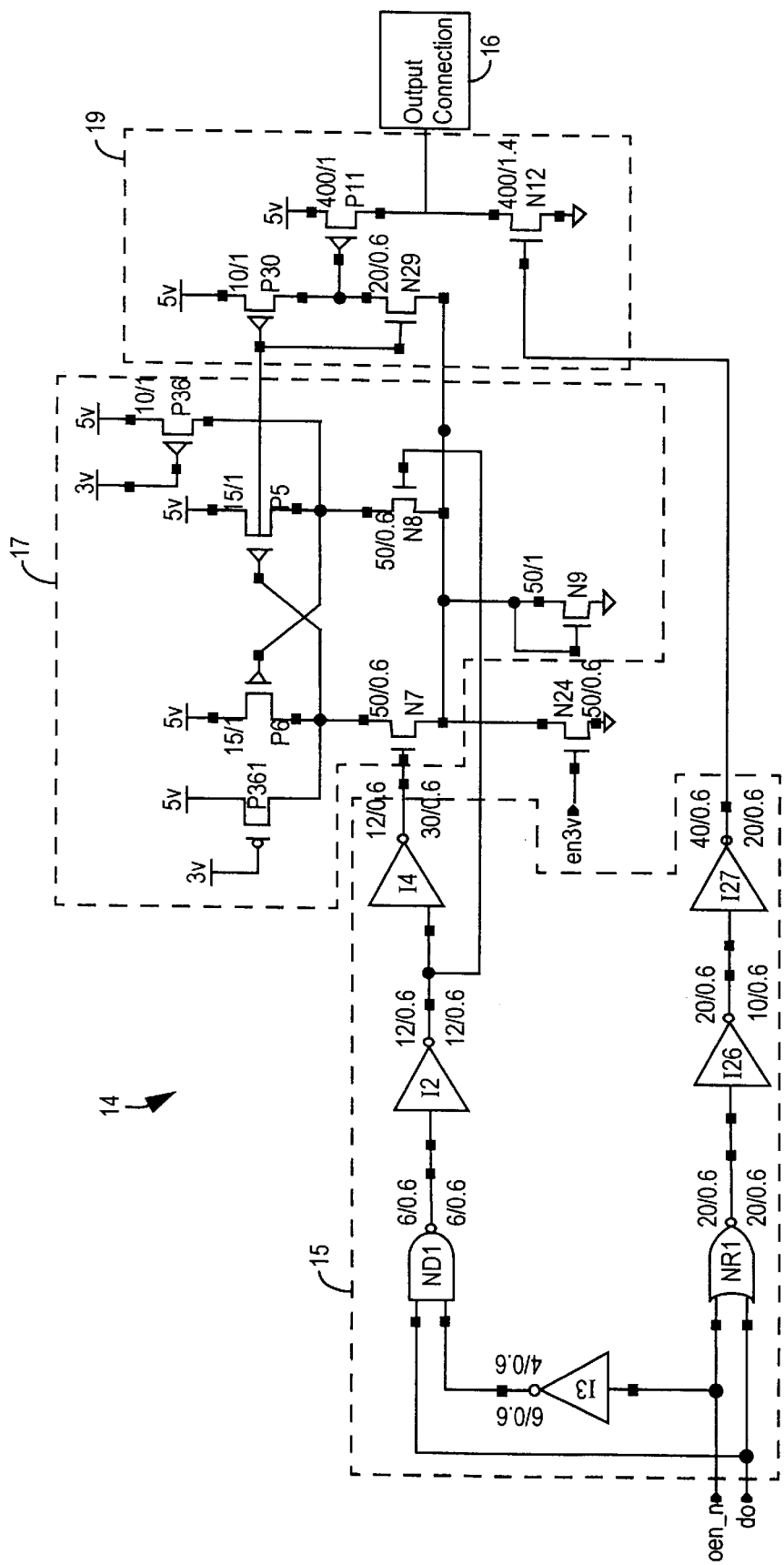
FIG. 3 is a schematic diagram of an output circuit constructed in accordance with an embodiment of the present invention.

The present invention solves the problem of providing 5 volt signals as output signals from a chip manufactured in a 3 volt process. FIG. 3 is a schematic diagram depicting the output circuit 14 of the present invention. Like the rest of the chip 10, this output circuit 14 is manufactured in a 3 volt process.

The output circuit 14 receives an output enable signal (oen_n) that enables the output circuit 14 to drive an output signal to the output connection 16. The output signal is formed from an output data signal (Dout) generated by the logic circuitry 12. In the following description of an exemplary embodiment, a low voltage level represents a logical low signal, and a high voltage level represents a logical high signal. However, other embodiments of the invention may use opposite representations of the high and low signals.

As will become apparent in the following description, the arrangement of the present invention prevents the oxide of any of the P channel or N channel devices in the output circuit from being exposed to 5 volt differentials. This prevents the rapid degradation and failure of these devices, making the chip 10 more reliable.

The present invention prevents the exposure of the oxide of the devices from 5 volts by the creation of a pseudoground (or "virtual ground") that is maintained at 1 volt, rather than at 0 volts. In order to create the pseudoground, located at node 34, a pair of P channel transistors P36 and P361 are used. The source for each of these transistors P36, P361 is at 5 volts, and the gate is at 3 volts. Therefore, these transistors P36, P361 will be on, but not fully on. Leakage current is therefore provided by the transistors P36, P361 to P channel transistors P5 and P6.

Two paths to actual ground are provided, with one path comprising the transistors P36, N8 and N9. (The designation "N" refers to an N channel transistor.) The other path comprises the transistors P361, N7 and N9. The creation of the pseudoground will be explained more fully by the following descriptions of the operation of the output circuit 14 for two different logic level data output signals.

The output circuit 14 is enabled to drive the output data signal Dout off-chip when the output enable signal oen_n is at a low level (0 volts). The output data signal Dout is at a logic low level when the voltage at the Dout input is 0 volts, and is at a logic high level when the voltage at the Dout input is 3 volts. Assume now that the output data signal Dout is at a logic low level (0 volts) and the output circuit 14 is enabled (oen_n=0 volts). This causes a first input to a NAND gate ND1 to be low, and a second input, coupled to an output of an inverter I3, to be high.

The output of the NAND gate ND1 is high and is received by an inverter I2 that generates a low signal. The output of the inverter I2 is connected to the input of another inverter I4 and also to the gate of an N channel transistor N8. The low signal received at the gate of transistor N8 causes this transistor to turn off. Another N channel transistor N7 is coupled to the output of the inverter I4 and therefore receives at its gate a high level signal (3 volts) from this inverter I4, and is therefore on.

A path to ground is formed by transistors P361, N7 and N9. The drain and gate of transistor N9 are coupled together. The transistor N9 is designed to be in a saturation mode as soon as 1 volt is reached at node 34. The voltage at node 34 will therefore remain at 1 volt and form the pseudoground when the voltage is pulled down from the 5 volts at the source of transistor P361 by the transistors N7 and N9.

Since the transistor N8 is off, the voltage at node 36 will be 5 volts. The gate of the P channel transistor P6 will also be at 5 volts, so that this transistor P6 will be off.

The voltage at node 38 will also be at 1 volt due to the pulling down by the transistor N7. A voltage of 1 volt will therefore be present at the gates of P channel transistor P5, P channel transistor P30, and N channel transistor N29. The 1 volt at their gates causes the P channel transistors P5 and P30 to turn on and the N channel transistor N29 to turn off. The voltage at node 40, to which the gate of a P channel transistor P11 is connected, is therefore 5 volts. The presence of 5 volts at the gate of the P channel transistor P11 turns this transistor off.

The low levels of the output data signal Dout and the output enable signal oen_n produce a logic high at the output of a NOR gate NR1. This signal is inverted by an inverter I26, and inverted again by a second inverter I27, so that the gate at the N channel transistor N12 receives a logic high signal (3 volts). This turns the N channel transistor N12 on.

Since the P channel transistor P11 is off and the N channel transistor N12 is on, the value of the output signal at node 42 is 0 volts, a logic low signal. This output signal is provided to the output connection 16, which forms the off-chip connection.

From the above description, it should be apparent that none of the transistors that are on in the output circuit 14 experiences a gate-substrate differential of 5 volts, which would cause relatively rapid degradation of the oxide layer of the transistor over time. Instead, the maximum voltage differential is 4 volts, since the minimum voltage present at the gates of the transistors that are on is 1 volt, and not 0 volts.

The operation of the output circuit of the present invention for producing high logic level output signals will now be described. Assume now that the output data signal Dout is at a logic high level (3 volts) and the output circuit 14 is enabled (oen_n=0 volts). This causes the first input to the NAND gate ND1 to be high, and the second input, coupled to the output of an inverter I3, to be high.

The two high inputs to the NAND gate ND1 cause the NAND gate ND1 to generate a low level output signal received by the inverter I2. The high output of the inverter I2 turns on the N channel transistor N8. The low level signal from the inverter I2 is inverted again by the inverter I4 to a low level signal provided to the gate of the N channel transistor N7, turning this transistor off.

A path to ground is formed in this case by the transistors P36, N8 and N9. As discussed earlier, the transistor N9 is designed so that it will be in a saturation mode as soon as 1 volt is reached at node 34. The voltage at node 34 will therefore remain at 1 volt and form the pseudoground when the voltage is pulled down from the 5 volts at the source of transistor P36 by the transistors N8 and N9.

Since the transistor N8 is on, the voltage at node 36 will be 1 volt due to the pulling down by the transistor N8. The gate of the P channel transistor P6 will also be at 1 volt, so that this transistor P6 will be on.

The voltage at node 38 will be 5 volts, since N channel transistor N7 is off. A voltage of 5 volts will therefore be present at the gates of P channel transistor P5, P channel transistor P30, and N channel transistor N29. The 5 volts at their gates causes the P channel transistors P5 and P30 to turn off and the N channel transistor N29 to turn on. Since the pseudoground voltage at node 34 (connected to the source of N29) is maintained at 1 volt, the 1 volt will also be present at the drain of the N channel transistor N29 that is now on. The voltage at node 40, to which the gate of the P channel transistor P11 is connected, is therefore 1 volt. The presence of 1 volt at the gate of the P channel transistor P11 turns this transistor on.

The low levels of the output data signal Dout and the output enable signal oen_n produce a logic low at the output of the NOR gate NR1. This signal is inverted by the inverter I26, and inverted again by the second inverter I27, so that the gate at the N channel transistor N12 receives a logic low signal (3 volts). This turns the N channel transistor N12 off.

Since the P channel transistor P11 is on and the N channel transistor N12 is off, the value of the output signal at node 42 is 5 volts, a logic high signal. This output signal is provided to the output connection 16.

In this case also, in which a logic high data output signal is produced with a voltage level of 5 volts, none of the transistors that are on in the output circuit 14 experiences a gate-substrate differential of 5 volts, which would cause relatively rapid degradation of the oxide layer of the transistor over time. Instead, the maximum voltage differential again is 4 volts, since the minimum voltage present at the gates of the transistors is 1 volt, and not 0 volts.

An N channel transistor N24 provided in the illustrated embodiment serves the function of providing a true ground at node 34 when a 3 volt logic high data output signal is to be produced at the output connection. In this case, the sources of the transistors P361, P6, P5, P36, P30 and P11 are provided with 3 volts, and not 5 volts. The N channel transistor N24 is normally off, but is enabled by a signal en3 v when 3 volt logic high signals are to be produced by the output circuit. The two paths to ground are therefore P36, N8, N24 and P361, N7, N24.

The output circuit 14 of the present invention may be logically divided as indicated by the dashed lines in FIG. 3 into different functional blocks. The first block is the control signal logic circuit 15 that receives the 3 volt data signals to be generated as 5 volt output signals off the chip, and produces control signals as a function of the received data signals. A pseudoground generating circuit 17 is coupled to the control signal logic circuit 15. The control signals from the control signal logic circuit 15 are coupled to the N channel transistors N7 and N8 and control whether these transistors are on or off. The pseudoground generating circuit 17 generates the pseudoground (at node 34) greater than zero volts and intermediate output signals as a function of the control signals produced by the control signal logic circuit 15.

The third functional block is the output signal generation circuit 19 coupled to the pseudoground generating circuit 17. The output signal generation circuit 19 generates the 5 volt output signals as a function of the intermediate output signals generated by the pseudoground generating circuit 17. The intermediate output signals are received by the output signal generation circuit 19 at the gates of the P channel transistor P30 and the N channel transistor N29.

Figure 4:
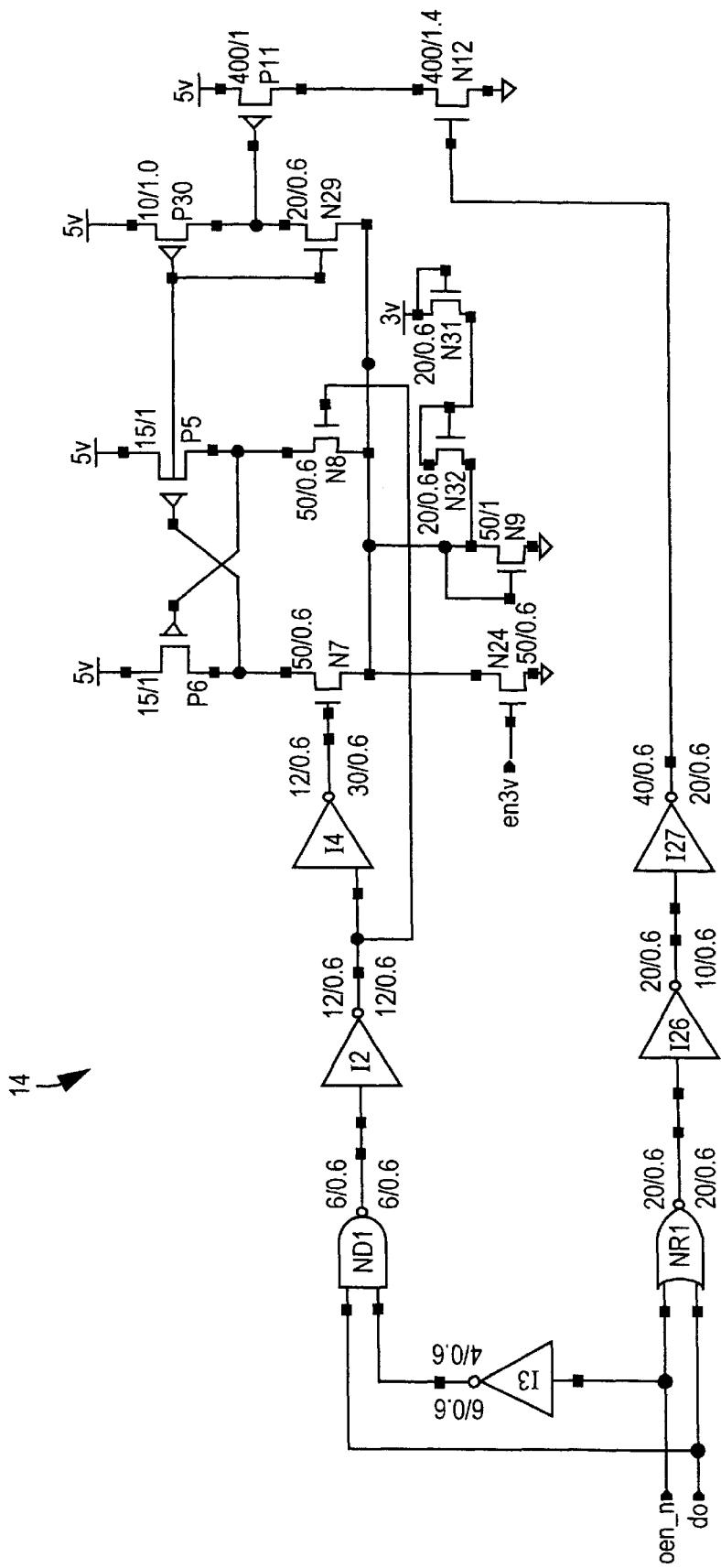
FIG. 4 is a schematic diagram of an output circuit constructed in accordance with another embodiment of the present invention.

FIG. 4 depicts an alternative embodiment of the present invention which is similar to the embodiment of FIG. 3. However, in the embodiment of FIG. 4, N channel devices N31 and N32 replace the functionality of P channel devices P36 and P361 of the output circuit of FIG. 3. The N channel device N31 has its drain and gate coupled to 3 volts. The source of the N channel device N31 is coupled to the gate and the drain of the N channel device N32. The source of the N channel device N32 is coupled to the drain and gate of N channel device N9. The N channel devices N31, N32 and N9 maintain the pseudoground at 1 volt throughout the operation of the output circuit 14.

The ratios provided next to each of the devices in FIG. 3 describes the size of the particular gate in the illustrated embodiment of the present invention. The first number, such as 400 for N12, represents the width of the gate, and the second number (1.4 for N12) represents the length of the gate. The ratios provided in FIG. 3 are exemplary only, as other ratios can be used for the devices without departing from the scope of the present invention.

The 3 volt process and the 5 volt data output signal level described above are exemplary only. The chip can be manufactured with a different process, and produce different voltage level output signals, than the values of 3 and 5 described for the exemplary embodiment.

The output circuit of the present invention provides the advantages of a chip fabricated in a 3 volt process that can interface with 5 volt devices, but that is still reliable since none of the devices of the chip are subjected to 5 volt differentials that would degrade the oxide layer in the devices.

Although the present invention has been described and illustrated in detail, it is clearly understood that the same is by way of illustration and example only and is not to be taken by way of limitation, the spirit and scope of the present being limited only by the terms of the appended claims.

We claim:

1. An output circuit for producing N-voltage level output signals from a chip manufactured in an M-voltage level process, where M is less than N, comprising:

a control signal logic circuit that receives M-voltage level data signals to be generated as N-voltage level output signals off the chip, and produces control signals as a function of the received data signals;

a pseudoground generating circuit coupled to the control signal logic circuit, the pseudoground generating circuit generating a pseudoground greater than zero volts and at least one intermediate signal as a function of the control signals produced by the control signal logic circuit; and an output signal generation circuit coupled to the pseudoground generating circuit, the output signal generation circuit generating the N-voltage level output signals as a function of the at least one intermediate signal generated by the pseudoground generating circuit.

2. The output circuit of claim 1, wherein the pseudoground generating circuit and the output signal generation circuit include semiconductor devices, and wherein a voltage differential across the semiconductor devices at any time is less than N volts.

3. The output circuit of claim 2, wherein one of the semiconductor devices of the pseudoground generating circuit is a first transistor coupled between pseudoground and ground, the first transistor saturating at voltages greater than the pseudoground.

4. The output circuit of claim 3, wherein the semiconductor devices of the pseudoground generating circuit also include second and third transistors that generate a leakage current at drains of the second and third transistors; a fourth transistor coupled between the pseudoground and the second transistor; a fifth transistor coupled between the pseudoground and the third transistor; a sixth transistor coupled to the fourth transistor; and a seventh transistor coupled to the fifth transistor;

wherein the second, fourth and first transistors form a first path to ground in response to a first one of the control signals from the logic generation circuit, and the third, fifth and first transistors form a second path to ground in response to a second one of the control signals;

wherein the at least one intermediate signal is generated at a connection between the second and fourth transistors.

5. The output circuit of claim 2, wherein the output signal generation circuit includes:

a first transistor and a second transistor, with drains of the first and second transistors being coupled to one another, and gates of the first and second transistors being coupled to one another and to the pseudoground generating circuit to receive the at least one intermediate signal;

a third transistor having a gate coupled to the drains of the first and second transistors;

and a fourth transistor having a gate coupled to the logic generation circuit and a drain coupled to a drain of the third transistor, wherein the N-voltage level output signals are generated at the drains of the third and fourth transistors.

6. The output circuit of claim 1, further including an M-volt enable circuit coupled to the pseudoground generating circuit, the M-volt enable circuit selectively enabling the output circuit to generate M-voltage level output signals by causing the pseudoground circuit to produce the at least one intermediate signal at zero and M voltage levels, and by replacing the pseudoground with an actual ground.

7. The output circuit of claim 1, wherein M is 3 and N is 5.

8. The chip manufactured in an M-voltage level process, comprising:

internal logic circuitry that generates M-volt data output signals;

an output connection at which output signals of the chip are produced; and an output circuit coupled between the internal logic circuitry and the output connection, the output circuit receiving the M-voltage level data output signals and generating N-voltage level data output signals, the output circuit having semiconductor devices wherein a voltage differential across each of the semiconductor devices at any time is less than N volts, wherein the output circuit includes:

a control signal logic circuit that receives the M-voltage level data output signals, and produces control signals as a function of the received M-voltage level data output signals;

a pseudoground generating circuit coupled to the control signal logic circuit, the pseudoground generating circuit generating a pseudoground greater than zero volts and at least one intermediate signal as a function of the control signals produced by the control signal logic circuit; and an output signal generation circuit coupled to the pseudoground generating circuit, the output signal generation circuit generating the N-volt data output signals as a function of the at least one intermediate signal generated by the pseudoground generating circuit.

9. The output circuit of claim 8, wherein the pseudoground generating circuit is connected to a semiconductor device of the output signal generation circuit and includes a first transistor coupled between pseudoground and ground, the first transistor saturating at voltages greater than the pseudoground.

10. The output circuit of claim 9, wherein the pseudoground generating circuit also includes second and third transistors that generate a leakage current at drains of the second and third transistors; a fourth transistor coupled between the pseudoground and the second transistor; a fifth transistor coupled between the pseudoground and the third transistor; a sixth transistor coupled to the fourth transistor; and a seventh transistor coupled to the fifth transistor;

wherein the second, fourth and first transistors form a first path to ground in response to a first one of the control signals from the control signal logic circuit, and the third, fifth and first transistors form a second path to ground in response to a second one of the control signals; and wherein an intermediate signal is generated at a connection between the second and fourth transistors.

11. The output circuit of claim 10, wherein the output signal generation circuit includes:

a first transistor and a second transistor, with drains of the first and second transistors being coupled to one another, and gates of the first and second transistors being coupled to one another and to the pseudoground generating circuit to receive the intermediate signal;

a third transistor having a gate coupled to drains of the first and second transistors;

and a fourth transistor having a gate coupled to the logic generation circuit and a drain coupled to a drain of the third transistor, wherein the N-voltage level output signals are generated at the drains of the third and fourth transistors.

12. The output circuit of claim 8, further including an M-volt enable circuit coupled to the pseudoground generating circuit, the M-volt enable circuit selectively enabling the output circuit to generate M-volt data output signals by causing the pseudoground circuit to produce the intermediate output signals at zero and M voltage levels, and by replacing the pseudoground with an actual ground.

13. The output circuit of claim 8, wherein M is 3 and N is 5.

* * * * *